US008889471B2

(12) United States Patent
Abed et al.

(10) Patent No.: US 8,889,471 B2
(45) Date of Patent: Nov. 18, 2014

(54) BURNTHROUGH FORMULATIONS

(75) Inventors: Ovadia Abed, Austin, TX (US); Yunjun Li, Austin, TX (US); James P. Novak, Austin, TX (US); Samuel Kim, Austin, TX (US); Patrick Ferguson, Austin, TX (US)

(73) Assignee: Sichuan Yinhe Chemical Co., Ltd. (CN)

( * ) Notice: Subject to any disclaimer, the term of this patent is extended or adjusted under 35 U.S.C. 154(b) by 0 days.

(21) Appl. No.: 13/465,244

(22) Filed: May 7, 2012

(65) Prior Publication Data

US 2012/0288991 A1 Nov. 15, 2012

Related U.S. Application Data

(60) Provisional application No. 61/484,039, filed on May 9, 2011.

(51) Int. Cl.
| H01L 31/0224 | (2006.01) |
| H01L 31/18 | (2006.01) |
| H01B 1/22 | (2006.01) |
| C09D 11/02 | (2014.01) |
| B05D 5/12 | (2006.01) |
| H01L 21/306 | (2006.01) |
| C09K 13/00 | (2006.01) |
| B82Y 30/00 | (2011.01) |
| H01B 1/02 | (2006.01) |

(52) U.S. Cl.
CPC .......... *H01B 1/02* (2013.01); *H01L 31/022425* (2013.01); *Y02E 10/50* (2013.01); *Y10S 977/773* (2013.01)

USPC .......... 438/98; 252/512; 252/513; 252/514; 252/79.3; 427/123; 136/256; 257/E31.124; 257/E21.159; 977/773

(58) Field of Classification Search
USPC .......... 438/98; 252/512–514, 79.3; 427/123; 136/256; 257/E31.124, E21.159; 977/773
See application file for complete search history.

(56) References Cited

U.S. PATENT DOCUMENTS

| 5,118,362 | A | 6/1992 | St. Angelo et al. |
| 5,151,377 | A * | 9/1992 | Hanoka et al. .................. 438/98 |
| 6,085,655 | A | 7/2000 | Harris et al. |
| 6,914,115 | B2 * | 7/2005 | Spyrou et al. .................... 528/45 |
| 7,645,436 | B1 * | 1/2010 | Ryang ............................ 423/511 |
| 7,837,890 | B2 | 11/2010 | Stockum et al. |
| 2006/0014656 | A1 | 1/2006 | Egbe et al. |
| 2008/0142083 | A1 * | 6/2008 | Yu et al. ......................... 136/264 |
| 2009/0053525 | A1 * | 2/2009 | Kamikoriyama et al. ..... 428/409 |
| 2010/0000762 | A1 * | 1/2010 | Yang et al. .................. 174/126.1 |
| 2010/0163810 | A1 | 7/2010 | Ginley et al. |
| 2010/0300522 | A1 * | 12/2010 | Ginley et al. ................. 136/256 |
| 2012/0129332 | A1 * | 5/2012 | Reddington et al. .......... 438/610 |
| 2012/0181668 | A1 * | 7/2012 | Doll et al. ...................... 257/618 |

OTHER PUBLICATIONS

International Searching Authority, International Search Report and the Written Opinion, International Application No. PCT/2012/036880, dated Aug. 10, 2012.

* cited by examiner

*Primary Examiner* — Colleen A Matthews
*Assistant Examiner* — Regan J Rundio
(74) *Attorney, Agent, or Firm* — Kelly Kordzik; Matheson Keys & Kordzik PLLC

(57) ABSTRACT

For solar cell fabrication, the addition of precursors to printable media to assist etching through silicon nitride or silicon oxide layer thus affording contact with the substance underneath the nitride or oxide layer. The etching mechanism may be by molten ceramics formed in situ, fluoride-based etching, as well as a combination of the two.

26 Claims, 2 Drawing Sheets

BURNTHROUGH FORMULATIONS

This application claims priority to U.S. Provisional Application Ser. No. 61/484,039, which is hereby incorporated by reference herein.

TECHNICAL FIELD

The present invention is related to inks and paste formulations for the metallization of solar cells in which "burnthrough" (e.g., penetration through a layer such as silicon nitride) is utilized to make contact with the materials below.

BACKGROUND AND SUMMARY

Silicon nitride or silicon oxide layers may be made on silicon and on other substrates. These layers may perform as anti-reflecting, passivation, or electronically insulating layers. By design, the nitride and oxide layers are highly resistant to material diffusion and are also chemically resistant to most reactions. Such layers present an obstacle when it is desired to form direct contact with the substrate underneath them. In some cases, it is desired to selectively etch specific areas of these impervious layers as recited in a desired pattern while keeping the rest of the coating intact. Typical methods for patterned etching are laser ablation and chemical etching using a photoresist layer or protective mask. Laser ablation uses a focused laser combined with a tracking mirror to effectively remove the silicon nitride layers from the surface. Adjustment of the laser power and wavelength allows for selective removal of just the top nitride or oxide layers on top of the silicon. Chemical etching is another method for surface coating layer removal.

Consider an example of printing a pattern on nitride-coated silicon using metal-containing ink or paste with the intention of forming an electrical contact between the metal and the silicon underneath the nitride layer. One approach to achieving this goal is coating the substrate with a protective layer mask as recited in a predetermined pattern. This mask keeps the desired pattern exposed; then, the substrate is treated with etching reagents. One manner for etching these layers involves using wet reagents based on hydrofluoric acid (HF) and/or phosphoric acid ($H_3PO_4$). These reagents may be applied by involve dipping the substrate or covering it with a film of the liquid reagent. The protective layer can later be removed. After the desired pattern is etched, it is possible to print the metal ink on the now-exposed pattern. This approach involves three steps: the two steps of forming and removing of the protective layer, and the etching step itself. In addition, it poses technical requirements of aligning the printer as recited in the pattern. Another approach is adding the etching reagent directly into the metallic ink or paste, thus allowing the reagents in the ink to etch its way through the nitride or oxide layer. This approach eliminates the use of protective coatings and a dedicated etching step.

Currently, this objective may be achieved by adding low melting point glass frits to the printed media, e.g., addition of glass frit to a printed media of silver paste composed of silver particles. After printing the paste, the whole substrate is exposed to elevated temperatures sufficient to melt the glass frit. The molten glass frit reacts with the silicon nitride or oxide layer and allows the silver particles to diffuse and contact the silicon, layer underneath. The areas that were not printed with the paste are not etched. The glass frit may act as a flux that helps to etch the surface of metallic particles in the media and helps joining them together to increase adhesion.

The glass frit may be added in the form of powder to the printed media. This approach has drawbacks. The particle size of the powder may limit its application or print methods. Small particle size is required to allow the particles to pass through a small print nozzle. Typically, the particle diameter in the ink must be at least 20 times smaller than the inner diameter of the nozzle or print opening. More preferably, the particle size will be at least 50 times smaller than the nozzle diameter. In one example, inkjet printing nozzles may have a diameter of 20 microns. It is difficult to obtain glass frit materials below 1 micron in diameter, as the glass frit is manufactured by milling larger sizes of the glass composition into small particles. As a result, it is almost impossible to form inks that comprise stable dispersions of glass frits, and it is not trivial to inkjet such formulations.

Aspects of the present invention utilize in situ formation of glass and ceramics to assist a burnthrough of silicon nitride and silicon oxide layers using oxides, oxide forming precursors, or mixtures thereof. Embodiments of the present invention produce the glass frit in situ from soluble or dispersible components, which upon exposure to elevated temperatures form the desired glass that etches the nitride or oxide layer, enabling the metallic particles to reach the silicon substrate underneath the etched layer.

An advantage of this approach, as reflected from the previous discussion about the drawbacks of conventional glass frits, is that the glass composition can be determined by modifying the glass forming components and proportions. The glass forming components can be fully dissolved in the media, thus eliminating problems associated with dispersion. This approach provides a very flexible tool for designing glass with the optimal properties. This approach is valid even when the glass forming components are not soluble in the media.

Identity of the Active Species Responsible for Etching:

In either case, whether ready-made glass frit or glass-forming materials are employed, the nature of the active species is ambiguous (e.g., not well defined) due to other components that may be present in the formulations. These include metal oxides and salts. Such additives can react with the molten ready-made glass or with the glass-forming materials, thus creating a new species with different activity and chemical definition. The active species responsible for etching the nitride or oxide coating is a relatively low-melting inorganic material, but its identity may not be necessarily defined as glass. The next paragraphs further explain this point and show the broad definitions and interpretations available for glasses and ceramics.

Glasses are noncrystalline structures, usually consisting of mixtures of oxides, mainly of silicon, boron, phosphorus, potassium, sodium, lead, antimony, bismuth as well as other elements. It is also possible to have glasses that become crystalline at room temperature, and may not be defined as glasses under certain terms. Glasses may contain negatively charged elements other than oxygen, such as in the case of fluorosilicate and beryllium fluoride-based glasses.

Ceramics:

From the Kirk Othmer Encyclopedia of Chemical Technology: "Ceramics may be defined as a class of inorganic, nonmetallic solids that are subjected to high temperature in manufacture or use. Ceramics are distinguished both from metals and metallic alloys and from organic materials such as polymers and plastics, and although syntheses may involve solutions or the final products are solids. The most common ceramics are oxides, carbides (qv), and nitrides (qv), but suicides, borides, phosphides, sulfides, tellurides, and selenides are ceramics, as well as elemental materials such as carbon and silicon. Ceramic synthesis and processing generally involve high temperatures and the resulting materials are refractory or heat resistant. Ceramics are commonly thought to include only polycrystalline materials, but glasses, which are noncrystalline, and single-crystal materials such as ruby lasers, are classified as ceramics materials." From the foregoing definition, glasses fall into the wider group of ceramic materials.

Definition of Active Etching Species as Recited in Embodiments of the Invention:

As previously noted, the active species responsible for etching are low melting inorganic materials; however, the identity of these inorganic species may not be known due to the complexity of the etching process, which include reactions of the formulation components between themselves, reactions with the nitride or oxide coating, as well as reactions with the substrate beneath the coating. From the previous discussion, it is seen that the definition of the active species responsible for the etching is ambiguous (e.g., glass or ceramic). Therefore, in this disclosure, the glass frits are described as low-melt ceramics, thus defining aspects of the present invention as low-melt ceramic precursors, rather than glass-forming components. This definition includes glasses, as well as low-melting point inorganic materials, which may not be defined as glasses.

Low-melt ceramic precursors may be oxides of boron, bismuth, phosphorus, antimony, arsenic, tin, lead, zinc, cerium, aluminum, thorium, indium, as well as other elements. Also included are compounds that decompose to give oxides, hydroxides, or salts upon treatment at elevated temperatures. Examples include organic derivatives where the element of interest is covalently connected to organic structures, such as in boronic acids, boronate esters, dialkyltin oxides, etc., or by coordinative bond, such as in zinc-EDTA complex, bismuth-salicylic acid complexes, bismuth acetylacetonate, etc. Inorganic salts such as beryllium fluoride having a melting point of 554° C. are included as well.

Another benefit that arises from using ready-made glass frits known in the art, or low-melt ceramic precursors as herein disclosed, is better adhesion of the coating to the substrate, since the molten ceramics, once cooled and solidified, function as a binder.

Another approach according to aspects of the present invention involves organic fluoride salts and fluorine-containing polymers to assist burnthrough of silicon nitride and silicon oxide layers. Certain phosphate and fluoride salts are capable of etching the nitride or oxide layers. U.S. Pat. No. 7,837,890 describes formulation of printing media paste using ammonium fluoride ($NH_4F$). The rational behind using ammonium fluoride is that it can decompose to hydrogen fluoride upon treatment at elevated temperatures The drawbacks of ammonium fluoride and also the analogues ammonium bifluoride ($NH_4FHF$) salts is that they are soluble only in water, only slightly soluble in alcohol, and cannot dissolve in common organic solvents. In order to use them in organic based formulations, it is necessary to disperse them. This fact presents a serious obstacle in using these materials in low viscosity liquids, such as inks, and limits their use to pastes where the high viscosity assists in forming homogenous dispersions stable long enough for practical use.

Herein is disclosed, a fluoride derivative never before tested. The fluoride derivative is a quaternary ammonium fluoride salt. The material shown at the example is tetraethylammonium fluoride. This material is easily soluble in water as well as in common organic solvents. This material, when added to a mixture of nickel nanoparticles and applied on silicon nitride coated silicon, clearly showed capabilities to etch the nitride coating and form an electrical contact between the cured nickel film and the silicon substrate.

DETAILED DESCRIPTION

Figure 1:
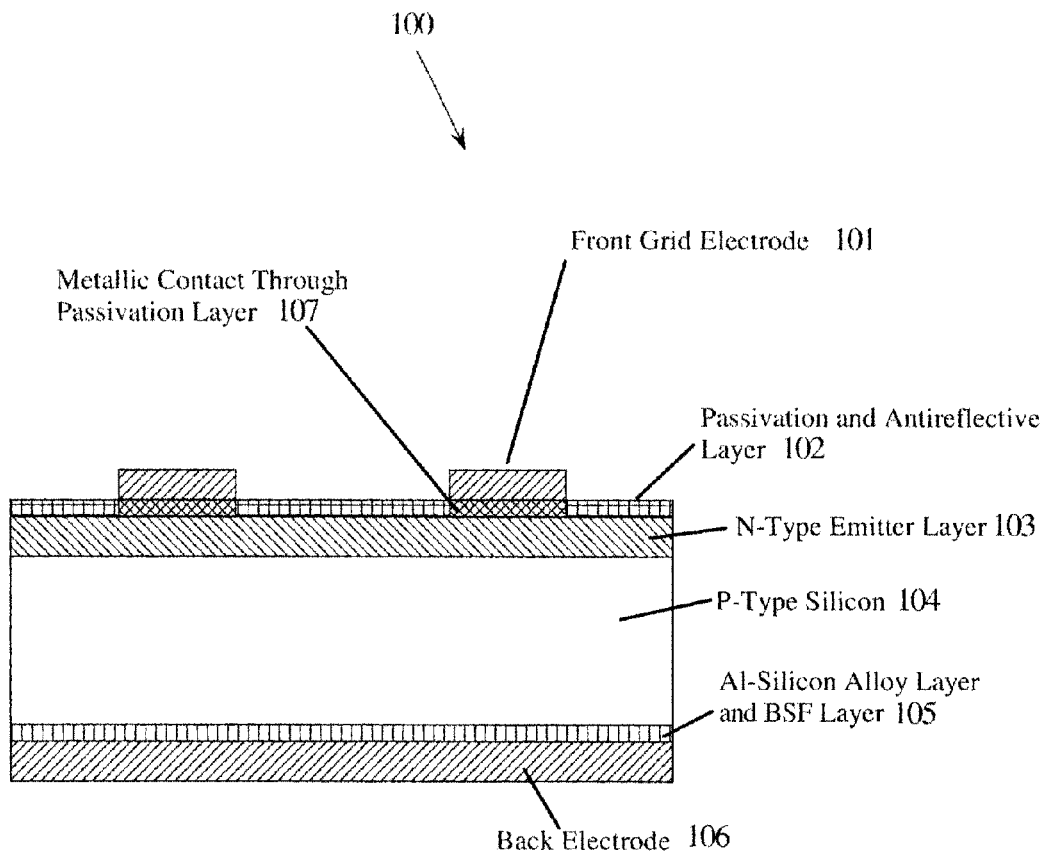
FIG. 1 illustrates embodiments of the present invention.

Referring to FIG. 1, there is illustrated an example of a structure of a solar cell 100 in accordance with embodiments of the present invention. Silicon solar cells use metal paste materials to create the electrical contacts on the front and backsides. Aluminum may be used for the p-doped side of the silicon, and silver may be used for the n-doped silicon. In a p-type solar cell, the p-doped side may be the back of the wafer, and the n-doped side may be the top of the wafer.

The solar cell structure 100 has dimensional limitations on the diffusion profile. For example, the overall wafer begins with p-type diffusion. This doping type penetrates the entire wafer 104. To create the diode junction, only a shallow region (e.g., less than 1 micron) is n doped to produce the n-type emitter layer 103. After the diode junction is created by the interface between the p and n doped regions, the respective sides are metallized to collect the electron-hole pairs generated by the photovoltaic effect in the operating solar cell 100.

Metallization layers may be applied using a printing method, such as direct screen printing. Other printing methods may be used, such as inkjet printing, spray printing, and/or aerosolized jet printing. Each of these printing procedures requires highly specialized ink or paste materials. A paste or ink material may comprise metal particles, inorganic components, solvents, dispersants, and/or vehicles components. Each of these components may vary in total percentage of the composition and may be tailored to achieve different functions (e.g., dispersion quality, control over viscosity, control of surface tension, control over surface energy and spreading). These types of metallic materials for printing are referred to as inks, yet the physical requirements of a particular ink depends on the utilized print or application method. Screen printing and nozzle dispensing generally utilize inks having a high viscosity (e.g., >1000 cP) and exhibiting a thick, paste consistency. Inkjet, spray printing, and aerosolized jets generally utilize a lower viscosity ink (e.g., <1000 cP). Nevertheless, embodiments of the present invention may utilize either inks or pastes.

Figure 2:
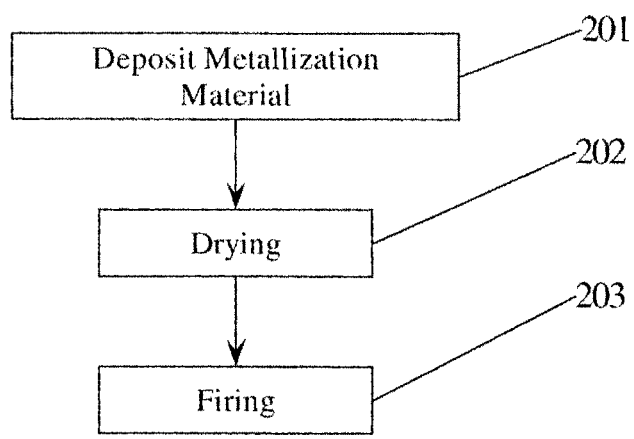
FIG. 2 illustrates a process as recited in embodiments of the present invention.

Referring to FIG. 2, there are several steps to process the printed metallization material before it can be considered an integral part of the solar cell. After placing (e.g., depositing, printing) the metallization material onto the silicon wafer in step 201, the material is dried in step 202, to remove any residual solvents and inhibit further spreading. After the drying step, the metallization paste is fired in step 203 to further remove volatile additives. This firing melts the sinter particles in the metallization material into a continuous film and diffuses the metal in the metallization material into the silicon forming an ohmic electrical contact. Each type of metallization layer has different requirements depending on the cell structure or architecture.

The same p-type solar cell 100 may have a silver metallic contact 101 on the top. The top of the cell 100 has a shallow region 103 that is doped n-type. This material (e.g., silver (Ag)) is deposited directly on top of a silicon nitride layer 102. The nitride layer 102 serves as a passivation layer and anti-reflective coating to protect the cell 100 and trap more light, respectively. The issue with firing this type of cell is that the top layer of silver is fired at a high temperature such that a reaction between the glass-frit additives in the paste and the silicon nitride can occur creating a diffusion channel for the silver metal to make a contact with the silicon. If the temperature is too low, no reaction with the nitride will occur and no contact will be formed. If the temperature is too high, the contact will be formed but the metal will diffuse rapidly through the n-type doping layer at the top of the cell. The relative rate steps for the reaction kinetics are very different. Empirically, the reaction between the glass frit and the nitride is relatively slow. Once the reaction has occurred, the diffusion of the silver into the silicon is relatively fast. If the metal passes the p-n interface junction, the cell will have poor performance. It is desirable to have the reaction with the nitride occur, the silver to diffuse through the nitride and make contact with the silicon, and then the wafer cooled down to prevent further diffusion of the silver into the silicon.

Embodiments of the present invention add boron oxide ($B_2O_3$) and organic fluoride salts to the nickel ink leads to form conductive contacts between the nitride-coated silicon substrate and the nickel once the ink is printed and fired. This effect occurs when either the boron oxide or the fluoride salt, is used alone or a mixture thereof. Embodiments for organic fluoride salts used are tetramethylammonium fluoride (TMF) and tetraethylammonium fluoride (TEF). The amount of these materials needed to achieve conductivity may be as low as 0.1% of the solids content. All these additives completely dissolve in the nickel ink. In embodiments, ink formulations containing both boron oxide and fluoride salt performed better than each component alone.

Control experiments utilizing nickel inks not containing the above additives failed to form conductive contacts when used on nitride-coated silicon wafers.

The mechanism by which the foregoing additives assist penetration through the nitride layer may involve the additives reacting with the nitride layer to form low melting point intermediate species which in turn, allow penetration and diffusion of the metal through the molten layer.

Unlike the glass frits that have been widely used as fine dispersions in solar pastes to achieve burnthrough, the configuration of the foregoing additives to completely dissolve in common organic solvents enables their incorporation into low viscosity inks without the previously noted concerns associated with particle size, particle dispersion, and settling.

Based on these results, other oxides and fluorocompounds may express similar results, either alone or as combination of several precursors. Examples may be phenyl boronic acid, which decomposes to boron oxide on firing, bismuth-salycilic acid complex, tetraalkylphosphonium fluorides, and fluorinated polymers which may decompose on heating to provide fluoride ions.

In an example of aspects of the present invention, nickel particles having diameters of 20 nanometers (e.g., commercially available from Mitsui Mining and Smelting Co., Ltd., Japan) were used to produce nickel ink formulations. Benzyl alcohol and diethyleneglycol monobutyl ether were used as solvents. Disperbyk 111 (e.g., commercially available from Byk Gardener, Columbia Md.). a phosphoric acid polyester, was used as a wetting agent. Thin solar wafers coated with 70 nm of silicon nitride were used as substrates. The nickel inks were printed (e.g., using an inkjet printer) to print a series of lines (e.g., having widths of 35 microns and lengths of 0.5 cm). The printed wafers were dried (e.g., 100° C. for 40 minutes). After this time, the specimens were heated in a tube furnace under a gas mixture (e.g., 10% hydrogen in nitrogen, also known as forming gas, at approximately 500° C. for 30 minutes). Additional samples were fired as low as 300° C. and a contact was formed through the silicon nitride. Samples were also fired as high as 700° C. and a contact was formed. After firing, the specimens were tested (e.g., using a four point probe method). The resistance between lines located at different distances was measured. Plotting the resistance as a function of the distance yielded a straight line. The intercept of the line, divided by two, and multiplied by the lines' area provided the contact resistance. More information on this test method can be found in the textbook "Semiconductor Material and Device Characterization" by D. K. Schroder, Wiley Interscience 2006.

Table 1 describes the nickel ink formulations tested. Formulation A served as a control and contained nickel nanoparticles, benzylalcohol and diethyleneglycol monobutyl ether as sol eats, and Byk111 as a dispersant. Formulations B and C were essentially control formulation A modified with boron oxide and TEF, respectively. Formulations D and E contained both boron oxide and TEF. The total percentage of boron oxide and TEF in formulation D was 1.45%. In formulation E, the total percentage of boron oxide and TEF was 0.03%, which is about two orders of magnitude lower. Formulation used TMF instead of TEF in the same order of magnitude as in formulation E. The contact resistance values achieved for each formulation is shown at the bottom of each column in Table 1.

Formulation A, which did not contain the additives disclosed herein that react with the silicon nitride layer, did not effectively form a conductive contact. Formulation D contained much more boron oxide and fluoride salt than formulations E and F, yet the contact resistance values were very similar for these three pastes. Formulations B and C, containing either boron oxide or fluoride salt, showed higher resistance (less conductivity) than formulations D-F containing both boron oxide and fluoride salt.

TABLE 1

Nickel Ink Formulations (% weight) tested and Contact resistance achieved

| | FORMULATION | | | | | |
|---|---|---|---|---|---|---|
| | A | B | C | D | E | F |
| Nickel nanoparticles | 16.00 | 15.76 | 15.55 | 15.67 | 15.90 | 15.89 |
| Benzyl alcohol | 72.00 | 71.82 | 70.83 | 71.39 | 72.42 | 72.39 |
| Diethyleneglycol monobutyl ether | 11.00 | 10.51 | 10.37 | 10.45 | 10.60 | 10.59 |
| Disperbyk 111 | 1.00 | 1.05 | 1.04 | 1.04 | 1.06 | 1.06 |
| Boron oxide | — | 0.86 | — | 0.46 | 0.01 | 0.01 |
| TEF | — | — | 2.21 | 0.99 | 0.02 | — |
| TMF | — | — | — | — | — | 0.05 |
| Total (% wt) | 100 | 100 | 100 | 100 | 100 | 100 |
| Contact Resistance (ohm · cm$^2$) | >1 × 10$^6$ | 2.3 | 1.7 | 0.21 | 0.32 | 0.11 |

What is claimed is:

1. An ink comprising metal particles, a solvent, a dispersant, and a low melting point ceramic precursor, wherein the low melting point ceramic precursor reacts with other oxygen containing materials to form oxides and hydroxides.

2. The ink as recited in claim 1, wherein the low melting point ceramic precursor forms a ceramic upon heating, wherein the ceramic reacts with silicon nitride allowing the metal particles to diffuse through the silicon nitride.

3. The ink, as recited in claim 1, wherein components of the low melting point ceramic precursor are selected from a group consisting of oxides, hydroxides and fluorides.

4. The ink as recited in claim 3, wherein the oxides, hydroxides, and fluorides are selected from a group consisting of silicon, boron, phosphorus, bismuth, zinc, lead, tin, antimony, arsenic, cerium, copper, silver, indium beryllium, vanadium, thorium, and cadmium.

5. The ink as recited in claim 1, wherein the low melting point ceramic precursor is configured so that the low melting point ceramic precursor forms oxides, hydroxides, or fluorides upon treatment at an elevated temperature.

6. The ink as recited in claim 5, wherein atoms of the low melting point ceramic precursor are connected to other atoms by covalent bonds, coordinative bonds, or salts.

7. The ink as recited in claim 6, wherein the low melting point ceramic precursor is selected from a group consisting of phenylboronic acid, triisopropyl borate, diphenylborinic acids, boric acid, dibutyltin oxide, Zn-EDTA complex, lead acetylacetonate, beryllium fluoride, zinc chloride, lead acetate and tetraethylammonium tetra fluoroborate.

8. The ink as recited in claim 5, wherein the elevated temperature is between 300° C. and 700° C.

9. The ink as recited in claim 5, wherein the elevated temperature is approximately 500° C.

10. The ink, as recited in claim 1, wherein the ink, is suitable to form conductive electrodes on a solar cell.

11. The ink as recited in claim 10, wherein the conductive electrodes have a contact resistance less than 1.7 ohm cm$^2$.

12. The ink as recited in claim 1, wherein the ink has a viscosity less than 1000 cP.

13. The ink, as recited in claim 1, wherein the metal particles comprise nickel nanoparticles.

14. The ink as recited in claim 13, wherein at least some of the nickel nanoparticles have diameters of 20 nanometers.

15. A method for making a solar cell comprising:
depositing a metal ink onto a silicon wafer, wherein the metal ink comprises nickel nanoparticles and a low melting point ceramic precursor;
drying the metal ink; and
firing the metal ink to form a conductive electrode having a conductive contact with the silicon wafer, wherein the firing of the metal ink creates in situ a glass frit composition from the low melting point ceramic precursor, which burns through an oxide layer on the silicon wafer to create the conductive contact between the conductive electrode and silicon wafer.

16. The method as recited in claim 15, wherein the low melting point ceramic precursor comprises both boron oxide and fluoride salts.

17. The method as recited in claim 15, wherein the firing temperature is between 300° C. and 700° C.

18. The method as recited in claim 15, wherein the low melting point ceramic precursor comprises boron oxide.

19. The method as recited in claim 16, wherein the fluoride salts comprise tetraalkylammonium fluoride salts.

20. The method as recited in claim 19, wherein the tetraalkylammonium fluoride salts are tetramethylammonium fluoride (TMF).

21. The method as recited in claim 19, wherein the tetraalkylammonium fluoride salts are tetraethylammonium fluoride (TEF).

22. The method as recited in claim 15, wherein the deposited metal ink has a viscosity less than 1000.

23. The method as recited in claim 15, wherein the firing temperature is approximately 500° C.

24. The method as recited in claim 15, wherein the conductive contact has a contact resistance less than 1.7 ohm cm$^2$.

25. The method as recited in claim 15, wherein the conductive contact has a contact resistance between 0.11 and 0.32 ohm cm$^2$.

26. The method as recited in claim 15, wherein the low melting point ceramic precursor forms a ceramic upon heating, wherein the ceramic reacts with silicon nitride allowing the metal particles to diffuse through the silicon nitride.

* * * * *